(12) United States Patent
Singh et al.

(10) Patent No.: US 8,400,103 B2
(45) Date of Patent: Mar. 19, 2013

(54) CLOCK SIGNAL GENERATOR

(75) Inventors: Fateh Singh, Montchamp (FR); Emeric Uguen, Domjean (FR)

(73) Assignee: NXP B.V., Eindhoven (NL)

( * ) Notice: Subject to any disclaimer, the term of this patent is extended or adjusted under 35 U.S.C. 154(b) by 265 days.

(21) Appl. No.: 12/960,365

(22) Filed: Dec. 3, 2010

(65) Prior Publication Data

US 2011/0298416 A1  Dec. 8, 2011

(30) Foreign Application Priority Data

Dec. 4, 2009 (EP) .................................. 09290916

(51) Int. Cl.
*H02J 7/00* (2006.01)
(52) U.S. Cl. ........................ 320/107; 327/291; 331/34
(58) Field of Classification Search ................ 320/107
See application file for complete search history.

(56) References Cited

U.S. PATENT DOCUMENTS

| | | | |
|---|---|---|---|
| 5,710,983 A | 1/1998 | Faber | |
| 6,107,851 A | 8/2000 | Balakirshnan et al. | |
| 6,229,366 B1 | 5/2001 | Balakirshnan et al. | |
| 6,249,876 B1 | 6/2001 | Balakrishnan et al. | |
| 7,026,851 B2 | 4/2006 | Yang et al. | |
| 7,176,738 B1 | 2/2007 | Hwang | |
| 8,175,207 B2 | 5/2012 | Do et al. | |
| 2005/0040893 A1 | 2/2005 | Paist et al. | |
| 2008/0301478 A1 | 12/2008 | Scott et al. | |
| 2009/0092213 A1 | 4/2009 | Eker et al. | |

FOREIGN PATENT DOCUMENTS

WO  02/25806 A1  3/2002

OTHER PUBLICATIONS

Extended European Search Report for Patent Appln. No. 10192988.3 (Mar. 18, 2011).
Extended European Search Report for Patent Appln. No. 09290916.7 (Apr. 23, 2010).

*Primary Examiner* — Ramy Ramadan (57) ABSTRACT

A clock signal generator comprising an input pin for receiving an oscillating signal and an output pin for providing a clock signal. The clock signal generator also comprises a frequency divider connected between the input pin and the output pin. The frequency divider having a plurality of frequency division factors associated therewith, wherein, in use, the frequency divider is configured to apply one of the plurality of frequency division factors as an in-use frequency division factor to the oscillating signal in order to generate the clock signal. The clock signal generator further comprising a controller configured to periodically replace the in-use frequency division factor with another of the plurality of frequency division factors.

17 Claims, 6 Drawing Sheets

CLOCK SIGNAL GENERATOR

This application claims the priority under 35 U.S.C. §119 of European patent application no. 09290916.7, filed on Dec. 4, 2009, the contents of which are incorporated by reference herein.

The present disclosure relates to the field of clock signal generators, and particularly, although not exclusively, clock signal generators that generate clock signals for switched mode power supplies.

BACKGROUND OF THE INVENTION

Electromagnetic interference (EMI) emissions from power supplies are an important problem and are often the cause of redesigns or additional costs in circuit design. EMI emissions are usually reduced by using control schemes such as zero voltage switching, valley switching, and frequency jittering.

Other methods to create frequency jitter include oscillators with capacitor switching as disclosed in U.S. Pat. No. 7,026,851 (Yang et al), dual oscillators as disclosed in U.S. Pat. No. 6,107,815 (Balakirshnan et al) and U.S. Pat. No. 6,229,366 (Balakirshnan et al), and current source modulation as disclosed in U.S. Pat. No. 6,249,876 (Balakirshnan et al).

The listing or discussion of a -published document or any background in the specification should not necessarily be taken as an acknowledgement that the document or background is part of the state of the art or is common general knowledge.

SUMMARY

According to a first aspect of the invention, there is provided a clock signal generator comprising:
an input pin for receiving an oscillating signal;
an output pin for providing a clock signal;
a frequency divider connected between the input pin and the output pin, the frequency divider having a plurality of frequency division factors associated therewith, wherein, in use, the frequency divider is configured to apply one of the plurality of frequency division factors as an in-use frequency division factor to the oscillating signal in order to generate the clock signal; and
a controller configured to periodically replace the in-use frequency division factor with another of the plurality of frequency division factors.

The clock signal generator may further comprise a counter configured to count the number of pulses in the output clock signal and/or in the received oscillating signal. The controller may be configured to replace the in-use frequency division factor with another of the plurality of frequency division factors when the count of the counter reaches a predetermined value.

Utilising a plurality of frequency division factors can ensure that any electromagnetic interference (EMI) is spread out over a range of frequency values, and not concentrated on a single clock frequency. Providing a controller that periodically replaces an in-use frequency division factor with another frequency division factor can be considered as a convenient implementation of achieving the clock frequency spread. For example, further oscillators may not be required to provide the control of the main oscillator, and this can reduce the silicon area/real-estate that is required by the clock signal generator. Furthermore, in some examples having a clock signal and an oscillator signal available at different frequencies can be advantageous as control signals can be available at different frequencies.

It will be appreciated that the period between consecutive replacements of the in-use frequency division factor may be regular/consistent or irregular/inconsistent.

The plurality of division factors can be selected so as to generate a clock signal with a frequency that varies over time around a centre frequency, and the centre frequency can be selected so that it is appropriate for use by an associated component/circuit such as a pulse width modulator for a switched mode power supply (SMPS).

The clock signal generator can be configured to reduce electromagnetic interference (EMI) by providing a clock signal with a variable frequency. It will be appreciated that periodically replacing the in-use frequency division factor causes the frequency of the clock signal to vary over time.

The clock signal generator/counter may be configured to receive a signal representative of a desired change rate of the in-use frequency division factor. The counter may be configured to apply a multiplier to the count in accordance with the desired change rate signal. The controller may be configured to periodically replace the in-use frequency division factor with another of the plurality of frequency division factors in accordance with the change rate of the of the in-use frequency division factor.

The signal representative of a desired change rate may be representative of user input. This can provide a user with functionality to tune the system, possibly in a laboratory prior to setting the parameters for a subsequent production run, and this may be considered as a definitive advantage in this difficult technical field.

The clock signal generator may further comprise a shift register configured to store (at least) a component of the plurality of frequency division factors. In some embodiments, the component of the frequency division factors may be the actual value of the frequency division factors, and in other embodiments, the component may be a variable component of the frequency division factor that can be added to a fixed component of the frequency division factor. In such embodiments, the fixed component may be selected so that the sum of a time-averaged value of the variable component and the fixed component represents the centre frequency of the clock signal.

The controller may be configured to shift the components of the plurality of division factors through the shift register, such that the next component of the plurality of division factors stored in the shift register contributes to the in-use frequency division factor for the divider when periodically replacing the in-use frequency division factor.

The plurality of frequency division factors may comprise a sequence of frequency division factors, and the controller may be configured to apply the frequency division factor that is next in the sequence of frequency division factors after the in-use frequency division factor when replacing the in-use frequency division factor. The controller may be configured to apply the first frequency division factor in the sequence when replacing the last frequency division factor in the sequence or may be configured to sequentially apply the frequency division factors in reverse order when the end of the sequence is reached.

Embodiments of a counter disclosed herein can enable a designer to choose a triangular variation of the frequency, that is a frequency that varies regularly from a minimum value to a maximum value, and back down to the minimum value. This can create a low frequency component in the PWM signal. As the human ear is not sensitive to all frequencies in the same way, and the audio noise generated by the SMPS can be a combination of the frequency modulation speed, amplitude, and the application components, amongst others, the functionality of being able to provide a user with the functionality to tune the system can enable any audio noise generated by the SMPS to be controlled in an improved way when compared with the prior art.

The sequence of frequency division factors may be sequential, or may be in an order that is randomly, or pseudo randomly, generated. The sequence of frequency division factors may consist of frequency division factors between upper and lower bounding values. The upper and lower bounding values may be equally spaced above and below the centre frequency.

The frequency division factors may be integer values.

The clock signal generator may further comprise a divider configured to divide the component of a frequency division factor that is output by the shift register by a jitter range input signal in order to provide a variable component of a frequency division factor. In this way, the jitter range input signal can be used to control the range of the variable component of the frequency division factor, and therefore the range of frequencies that will be output by the clock signal generator. This provides the functionality for EMI to be spread in a way that is considered appropriate for specific circumstances, and can provide a flexible implementation of the clock signal generator that can be used successfully in multiple scenarios.

The jitter range input signal can be representative of user input. This can enable a user to control the operation of the clock signal generator in situ.

The clock signal generator may further comprise a summation component that is configured to add the variable component of a frequency division factor to a fixed component of a frequency division factor in order to provide a frequency division factor. The value of the fixed component of a frequency division factor can be selected in accordance with the jitter range input signal, and this can enable a consistent centre frequency to be maintained in the output of the clock signal generator, even when the variable component is adjusted in order to change the range of frequency values.

The value of the fixed component of a frequency division factor can be selected in accordance with the jitter range input signal such that the sum of the time-averaged value of the variable component and the fixed component represents a centre frequency of the clock signal, and can be kept consistent irrespective of the value of the jitter range input signal.

The controller may further comprise a jitter range input configured to receive a signal representative of an upper and lower bounding value of the plurality of frequency division factors. The controller may be configured to apply a plurality of frequency division factors that satisfy the upper and lower bounding values of frequency division factors. The signal received at the jitter range input may be representative of user input. This can be advantageous as it can enable a system designer to chose any amplitude for the frequency variation, and change it with minimal effort and impact. It may be considered relatively easy to change a digital code in order to change and a synthesis that controls the jitter range. The jitter range can be made programmable, for example on the assembly line, in the field, or in a laboratory for testing. This can be important as EMI can be difficult to understand and correct. An analytical solution to identify an appropriate jitter range can be difficult, if not impossible, to find and therefore embodiments of the invention can provide a system that is convenient for a system designer to perform trial and error testing of different jitter ranges to determine a preferred jitter range.

The frequency of the clock signal may be configured to vary by 1%, 2%, 5%, 10%, or any other value that serves to sufficiently spread any EMI emissions whilst still providing a clock signal that is acceptable for use by any associated components/circuits.

The clock signal generator may be configured to receive only one oscillating signal. This can reduce the number of components that are required when compared with the prior art, and this can provide for a reduction in required silicon area.

There is also provided a system comprising:
 an oscillator for generating an oscillating signal; and
 any clock signal generator disclosed herein,
wherein the oscillator is connected to the clock signal generator such that the oscillating signal of the oscillator is provided to the input pin of the clock signal generator.

The system may further comprise a switched mode power supply (SMPS) that is controllable by the clock signal. The SMPS may be a fly-back converter, a Buck converter, a Boost converter, a Buck-Boost converter, or any other type of power supply or component that utilises a clock signal, including isolated and non-isolated topologies.

The system may be an LED driver, such as a mains supply connectable LED driver. The system may comprise only one oscillator.

There may be provided a low power adapter comprising any clock signal generator disclosed herein.

There may be provided a battery charger for a device, the battery charger comprising:
 a switched mode power supply;
 an oscillator; and
 any clock signal generator disclosed herein;
 wherein the oscillator is connected to the clock signal generator such that the oscillating signal of the oscillator is provided to the input pin of the clock signal generator, and the switched mode power supply is controllable by the clock signal of the clock signal generator.

The device may be a mobile telephone, a laptop computer, any device having a USB port, a digital photo frame, a camera, a camcorder, any device with batteries or any other device that is connectable to a mains power supply.

The switched mode power supply may be configured to generate a pulse width modulated signal in accordance with the clock signal.

There may be provided an integrated circuit (IC) comprising any clock signal generator or any system/device disclosed herein.

There may be provided a pulse width modulated (PWM) switch or a PWM controller coupled to any clock signal generator disclosed herein, whereby the output pin of the clock signal generator is provided as a clock input to the PWM switch or PWM controller.

There may be provided a digital frequency jitter circuit comprising any clock signal generator disclosed herein.

According to a further aspect of the invention, there is provided a method of operating a clock signal generator, the clock signal generator comprising a frequency divider having a plurality of frequency division factors associated therewith, and the method comprising:
 applying one of the plurality of frequency division factors as an in-use frequency division factor to frequency divide a signal received from an oscillator and provide a clock signal;
 periodically replacing the in-use frequency division factor with another of the plurality of frequency division factors.

The method may further comprise counting the number of pulses in the clock signal, and replacing the in-use frequency division factor with another of the plurality of frequency division factors when the counter reaches a predetermined value.

There may be provided a clock signal generator comprising:
an input pin for receiving an oscillating signal;
an output pin for providing a clock signal;
a frequency divider connected between the input pin and the output pin, the frequency divider having a plurality of frequency division factors associated therewith, wherein, in use, the frequency divider is configured to apply one of the plurality of frequency division factors as an in-use frequency division factor to the oscillating signal in order to generate the clock signal;
a counter configured to count the number of pulses in the output clock signal and/or in the received oscillating signal; and
a controller configured to replace the in-use frequency division factor with another of the plurality of frequency division factors when the count of the counter reaches a predetermined value.

There may be provided a method of operating a clock signal generator, the clock signal generator comprising a frequency divider having a plurality of frequency division factors associated therewith, and the method comprising:
applying one of the plurality of frequency division factors as an in-use frequency division factor to frequency divide a signal received from an oscillator and provide a clock signal;
counting the number of pulses in the clock signal and/or in the received oscillating signal;
replacing the in-use frequency division factor with another of the plurality of frequency division factors when the counter reaches a predetermined value.

There may be provided a computer program, which when run on a computer, causes the computer to configure any apparatus, including a clock signal generator, circuit, system, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

BRIEF DESCRIPTION OF DRAWINGS

A description is now given, by way of example only, with reference to the accompanying drawings, in which.

DETAILED DESCRIPTION

One or more embodiments described herein relate to a clock signal generator for providing a clock signal from a received oscillator signal. The clock signal generator can include a frequency divider to apply one of a plurality of frequency division factors to the oscillator signal in order to generate the clock signal. The clock signal generator can also include a controller that periodically replaces an in-use frequency division factor with another of the plurality of frequency division factors in order to adjust the frequency of the clock signal. This may be known as applying frequency jitter.

In this way, the frequency of the clock signal can be adjusted over time so that any electromagnetic interference (EMI) can be spread out over a frequency range. As an example, the frequency of the clock signal may vary by 1% around a central frequency value.

The clock signal can be used by a pulse width modulation signal generator for use with a switched mode power supply (SMPS).

Furthermore, in some embodiments a user can set the range of frequency values that are used to determine the maximum jitter, and the choice of the values and order of the plurality of frequency division factors can determine the spectral and temporal characteristics of the jittering frequency.

Figure 1:
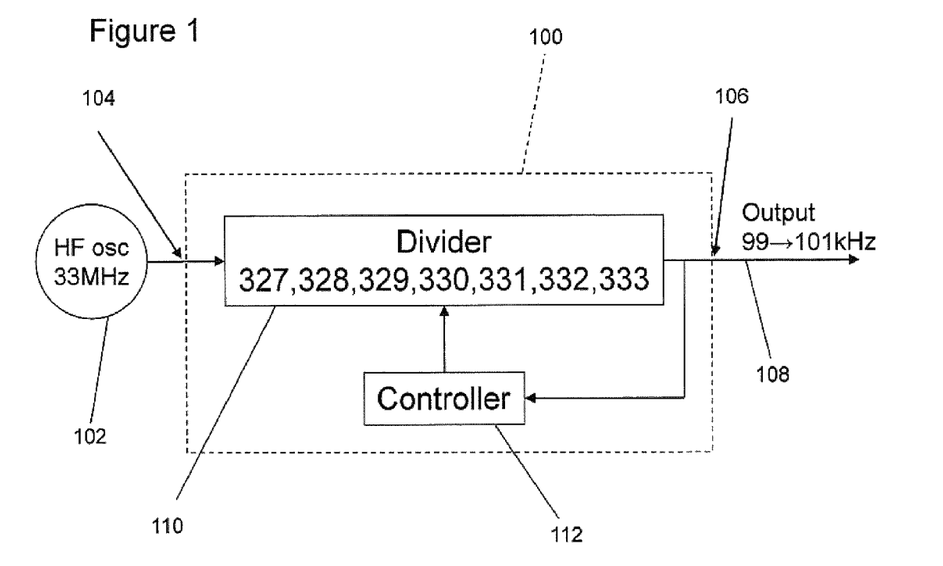
FIG. 1 illustrates a clock signal generator according to an embodiment of the invention.

FIG. 1 shows a clock signal generator 100 according to an embodiment of the invention. The clock signal generator 100 has an input pin 104 that is connected to an oscillator 102 and an output pin 106 that provides an output clock signal 108.

In this example, the oscillator 102 is a high frequency oscillator with a frequency of 33 MHz, and the output clock signal 108 has a frequency range of 99 to 101 KHz with a centre frequency of 100 KHz. The range of frequency values can be known as frequency jitter, and causes a variation in the timing of rising and falling edges of the clock signal. It will be appreciated that embodiments of the invention are not limited to the example frequency values or division factors described and illustrated herein.

The clock signal generator 100 includes a frequency divider 110 and a controller 112. The divider 110 has a sequence of seven frequency division factors associated with it, and the seven frequency division factors are: 327, 328, 329, 330, 331, 332, and 333. It will be appreciated that the mean value of the frequency division factors in this example is 330, and therefore the centre frequency of the output clock signal 108 will be 100 KHz, which is 33 MHz÷330. At any one time, one of the seven frequency division factors is in-use.

The controller 112 receives the output clock signal 106 as an input and periodically causes the in-use frequency division factor to be replaced with the next frequency division factor in the sequence. That is, a frequency division factor of 332 is replaced with the frequency division factor of 333, which in turn is replaced with the frequency division factor of 327 thereby returning to the start of the sequence, etc. In other examples, the frequency division factors may not be replaced in sequence.

It will be appreciated that the "in-use" frequency division factor is periodically replaced in order to adjust the frequency of the output clock signal 108. The period of replacement could be irregular or regular and may be set by a user. In one example, the in-use frequency division factor is replaced every 1 ms.

Advantages associated with the clock signal generator 100 of FIG. 1 include a reduction in silicon area that is required to implement the clock signal generator when compared with the prior art. This can be due to, at least in part, a requirement for only a single oscillator, whereas the prior art may require at least two oscillators. A further advantage can be that the signal generated by the high frequency oscillator 102 can also be utilised by any component associated with the clock signal generator 100, such as components that are configured to detect an event at a higher frequency than the frequency of the output clock signal 108. That is, an additional high frequency clock signal may be available, that is not available in the prior art.

Embodiments of the clock signal generator 100 described herein can be particularly useful for generating a clock signal for use with switched mode power supplies, and in particular pulse width modulator (PWM) signals for use with switched mode power supplies (SMPS). Also, embodiments of the invention may be particularly advantageous in low power systems, for example systems that use a power that is less than 20 W.

Figure 2:
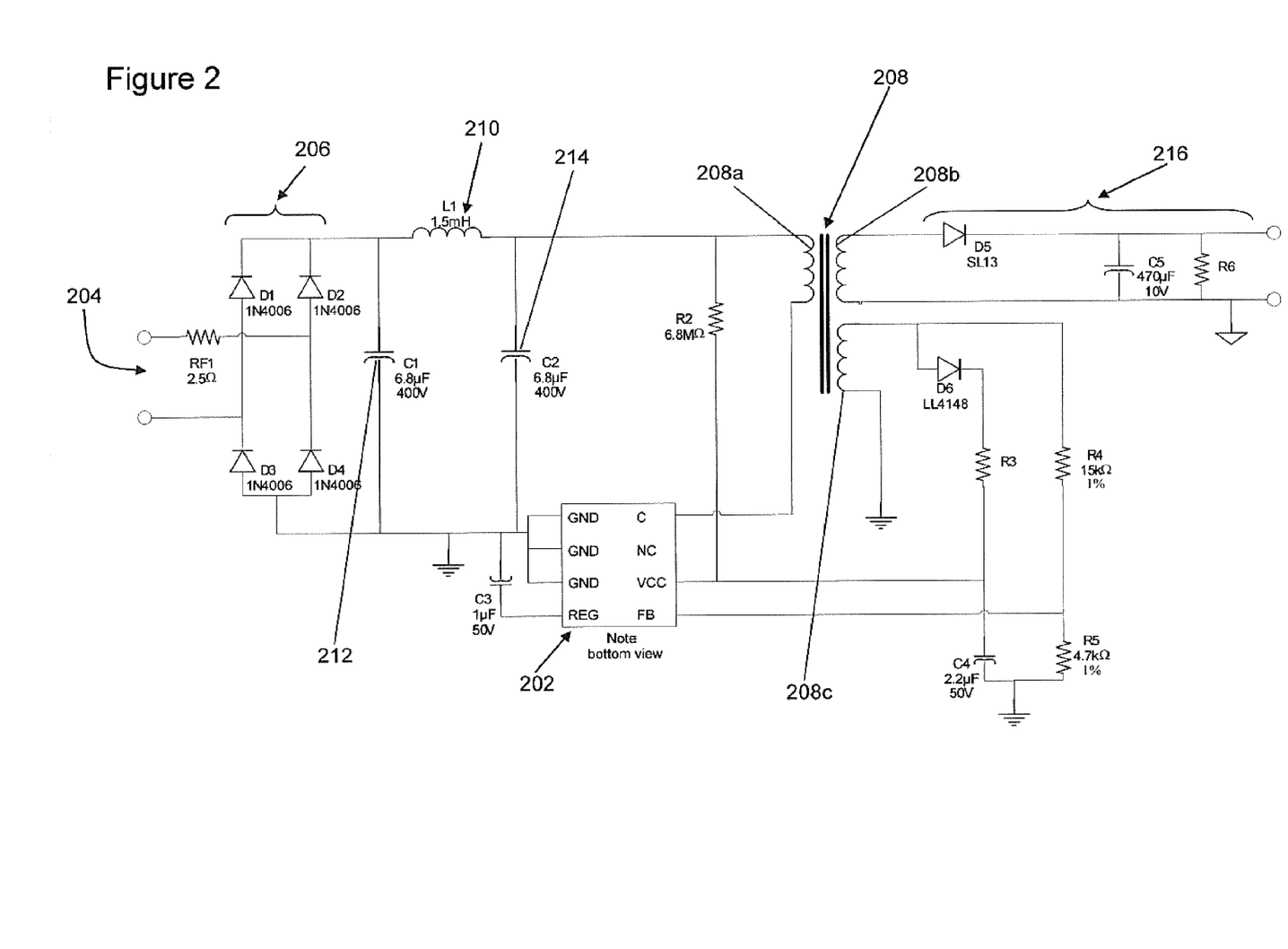
FIG. 2 illustrates a flyback converter comprising a clock signal generator according to an embodiment of the invention.

FIG. 2 illustrates schematically the circuit diagram of a switched mode power supply (SMPS), which in this embodiment is a flyback converter, using a low power adapter integrated circuit 202 according to an embodiment of the invention.

The fly-back converter receives an input voltage at terminals 204, and the input voltage is provided to a bridge rectifier 206. The positive output of the bridge rectifier is provided to a first terminal of the primary winding 208a of a transformer 208 of the flyback converter via an inductor 210. In addition, the negative output of the bridge rectifier 206 is provided to a low power adapter integrated circuit (IC) 202, and is also coupled to the positive output of the bridge rectifier 206 by two capacitors C1 212 and C2 214 in parallel. The two capacitors C1 212 and C2 214 are used for smoothing the output of the bridge rectifier 206.

Connected to the second terminal of the primary winding 208a of the transformer 208 is an output from the low power adapter 202 (the pin labelled C in FIGS. 2 and 3), and the low power adapter 202 will be described in more detail with reference to FIG. 3 below.

In this example, the transformer 208 has two secondary windings 208b, 208c. The first secondary winding 208b is coupled to an output stage 216 that is similar to that of a conventional flyback converter. The second secondary winding 208c is coupled indirectly to the VCC pin of the low power adapter 202 and the FB pin of the low power adapter 202. These connections between the second secondary winding 208c and the low power adapter 202 are well known in the art.

In some examples, the second secondary winding 208c can be split into two completely independent windings or be provided in series, one connected via a rectifier/capacitor to the VCC pin, and the other connected via a divider bridge to the FB pin. The split or non-split of this winding, and the connections to a common point, can be selected as a manufacturing and design choice.

Figure 3:
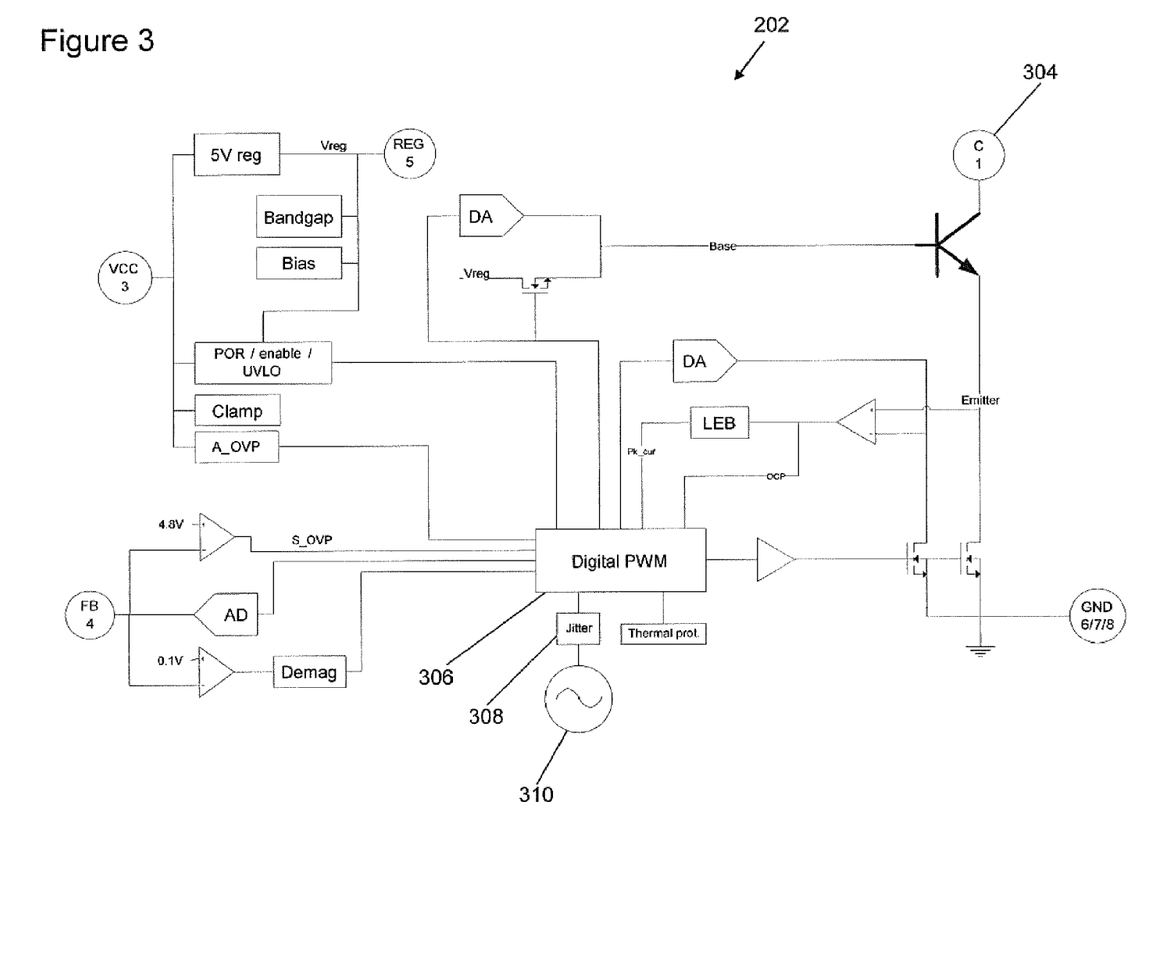
FIG. 3 illustrates a power adapter comprising a clock signal generator according to an embodiment of the invention.

FIG. 3 illustrates further details of the low power adapter IC 202 of FIG. 2 based on a digital core, AD's and DAC's. The low power adapter 202 is configured to generate a pulse width modulated (PWM) signal at the output terminal C 304 in accordance with conventional flyback converter circuits. The low power adapter 202 output signal 304 is provided at the pin labelled C, and is provided to the second terminal of the primary winding of the transformer 208 shown in FIG. 2.

The low power adapter 202 comprises a digital pulse width modulator (PWM) 306 that receives a clock signal from a jitter component 308, which in turn receives an oscillator signal from an oscillator 310. The jitter component 308 is an example of a clock signal generator according to an embodiment of the invention, and will be described in more detail with reference to FIG. 4.

Figure 4:
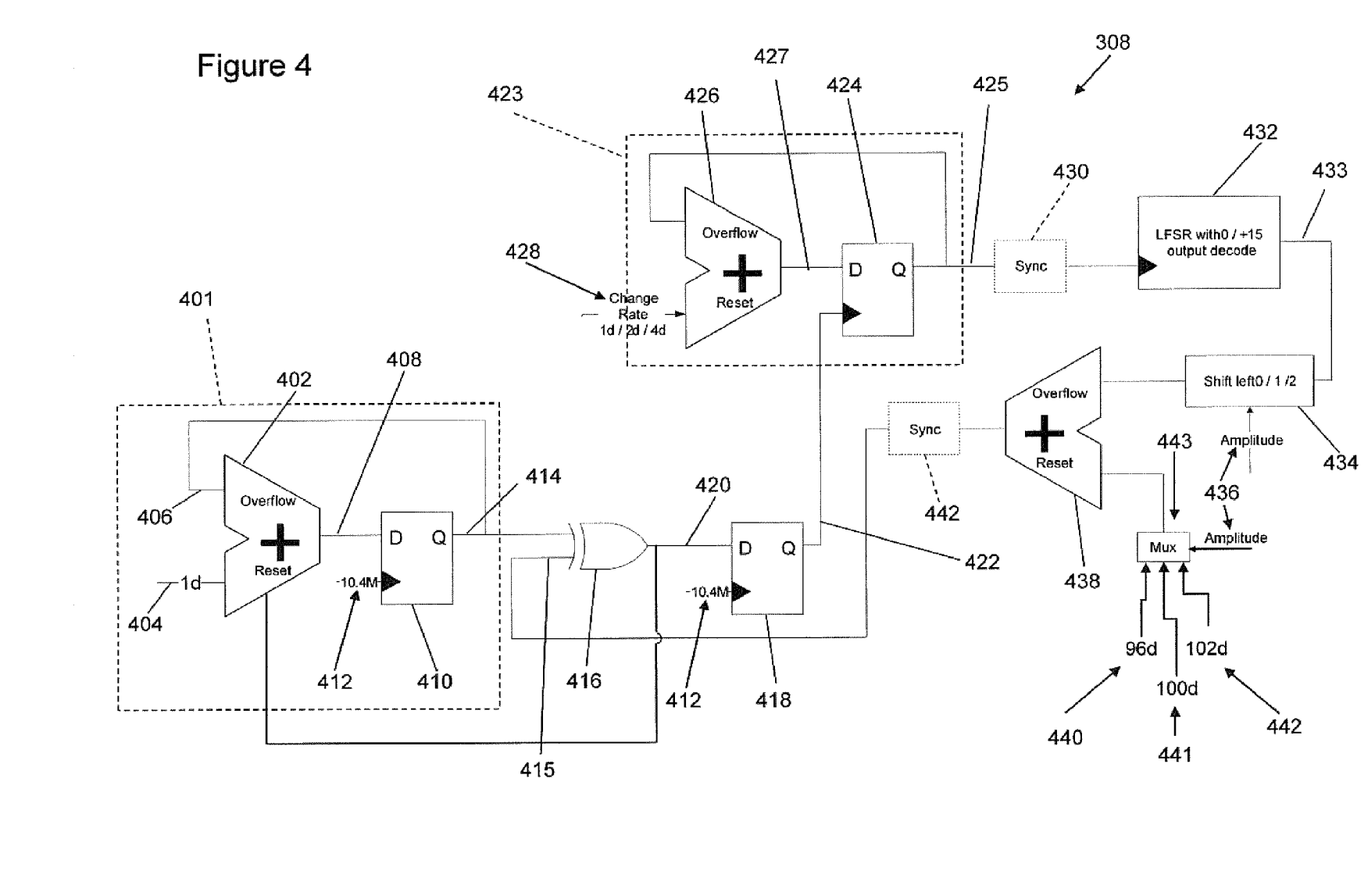
FIG. 4 illustrates a clock signal generator according to a further embodiment of the invention.
Figure 5:
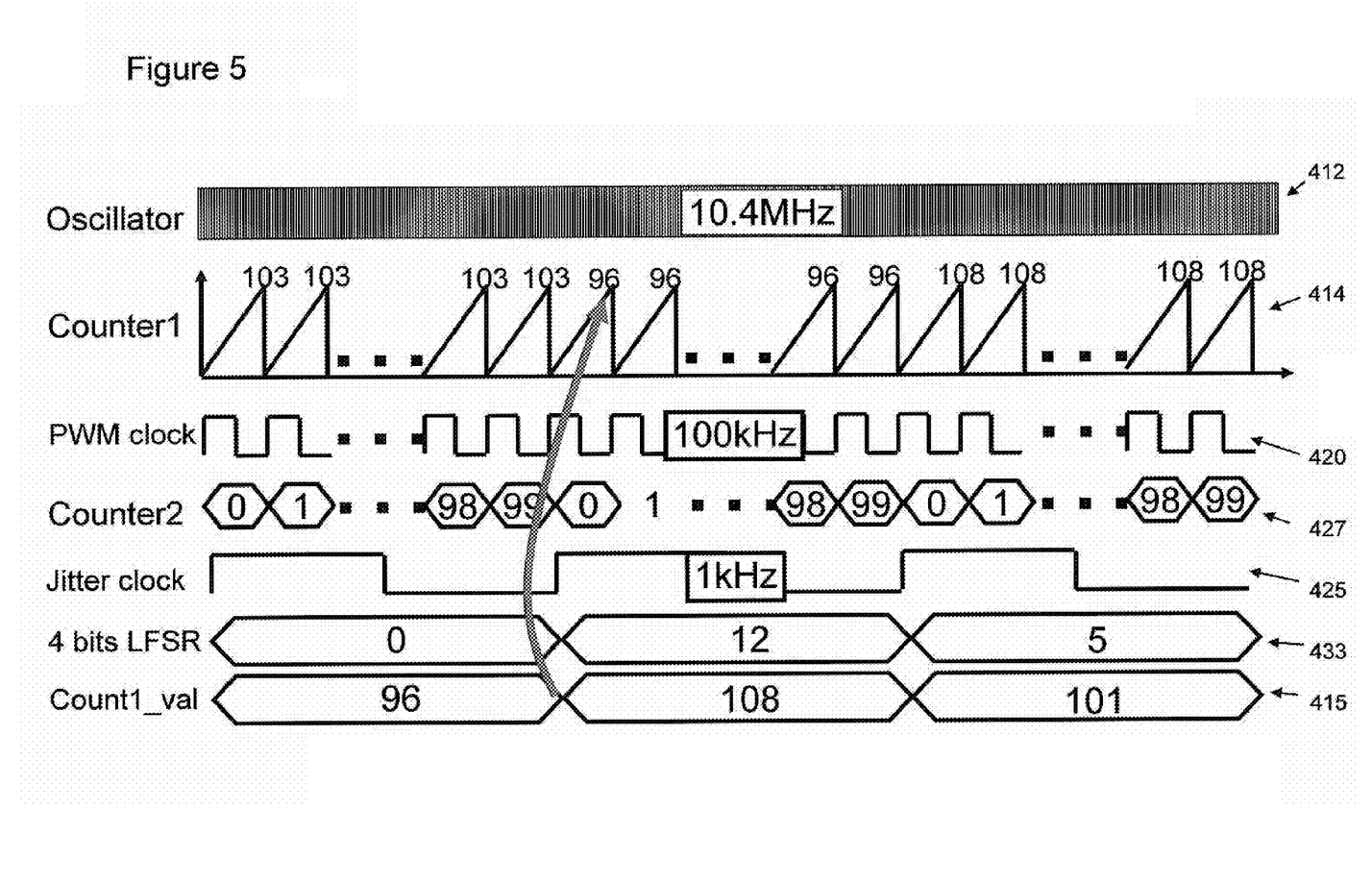
FIG. 5 illustrates schematically a high-level signal timing diagram illustrating use of a clock signal generator according to an embodiment of the invention.

FIG. 4 illustrates the jitter component 308 shown in FIG. 3, and FIG. 5 illustrates an example timing diagram showing signals during use of the jitter component 308. In this example the received oscillator frequency is 10.4 MHz and is shown with reference 412 in FIGS. 4 and 5.

A first counter 401, which in this example is a seven bit counter, consists of a first summation component 402 and a first register 410. The first summation component 402 receives an input signal 404 for every clock cycle of the 10.4 MHz oscillator, as represented by 1d 404. The "d" in "1d" is indicative of the preceding number being a decimal number, as opposed to hexadecimal or binary for example. The first summation component 402 also receives an overflow input signal 406, which is the output of the first register 410. The output of the first summation component 402 is provided as the data input to the first register 410.

Provided as the clock input to the first register 410 is the high frequency oscillator signal 412, which in this embodiment has a frequency of 10.4 MHz. The high frequency oscillator signal 412 can be received from a current controlled oscillator (CCO), which is not shown in FIG. 4. The Q output 414 of the register 410 is provided as the overflow input 406 to the first counter 402. In this way, the first counter 401 counts the number of oscillator pulses.

The summation component/adder 402 is made of logic, and the first register 410 is provided to make the system synchronous with the 10.4 MHz clock, which is the oscillator clock.

The Q output 414 of the first register 410 is also provided as a first input to an exclusive-or (X-OR) logic gate 416. The second input to the X-OR gate 416 is described below and represents the in-use frequency division factor. The output 420 of the X-OR gate 416 is representative of a comparison between the output signal 414 of the first counter 401 and the in-use frequency division factor, and is provided to a reset pin of the first counter 401. In this way, the first counter 401 counts the number of oscillator pulses until the count matches the in-use frequency division factor, at which point a reset signal is generated by the X-OR gate 416 and sent to the first counter 401. The incremental counting of the first counter is shown as reference 414 in FIG. 5.

The output 420 of the X-OR gate 416 is the output clock signal 420 of the clock signal generator. The output clock signal 420 is shown in FIG. 5 as having a frequency of 100 KHz, and it will be appreciated that 100 KHz is the time-averaged, centre frequency, of the output clock signal 420.

The output clock signal 420 is provided as the data input to an optional D-type flip flop 418. Also provided as the clock input to the second D-type flip-flop 412 is the 10.4 MHz oscillator signal 412. The optional D-type flip flop 418 can be used to re-synchronise the data path. The optional D-type flip flop 418 can be considered as a de-glitch flip flop. Using the output of a logic block to directly drive a synchronous block can generate glitches that may be taken as a valid transition. Therefore, re-synchronising with a flip flop can remove such unwanted behaviour.

The Q output 422 of the second D-type flip flop 418 is provided as a clock input to a third register 424. The third register 424 along with a second summation component 426 can be considered as a second counter 423, which in this embodiment is an eight bit counter.

The Q output of the third register 424 is provided as an overflow input to the second summation component 426. The output of the second summation component 426 is provided as the data input to the third register 424. A signal representative of a desired change rate (1d/2d/4d) 428 is provided as the reset input to the second counter 426. In this example, the change rate is (1d), which is representative of the count increasing by 1 for each clock cycle of the output signal 420. IN other examples the count can be increased by two (2d) for each clock cycle of the output signal 420, or four (4d) for each clock cycle of the output signal 420. The desired change rate signal 428 can be representative of user input, which can be set in accordance with specific design requirements of the clock signal generator.

The output signal 425 of the second counter 423 is representative of when an in-use frequency division factor should be changed. As an example, if the second counter 423 can count up to 200, and the change rate is representative of 2d, then at each of the clock cycles of the output clock signal 420 the count is increased by two at the change rate input 428. This will cause the second counter 423 to generate an overflow signal 425 at a frequency of 1 KHz. That is, the frequency of the overflow signal 425 equals the frequency of the output clock signal 420 (in this example 100 KHz) multiplied by the change rate 428 (in this example 2d), divided by the overflow value of the second counter 423 (in this example 200).

In this way, the counter 423 can count the number of pulses in the output clock signal 420, and cause the in-use frequency division factor to be changed when the counter 423 reaches a predetermined value. The predetermined value in this example is the overflow value of the second counter divided by the change rate 428, and the change rate signal 428 represents a multiplier that is applied to the count. In other examples the change rate signal 428 may not be required, and the predetermined value can be the overflow value of the second counter 423. In further examples still, pulses in the received oscillating signal, which in this example is received from a 10.4 MHz oscillator, can be counted and used instead of, or as well as, the count of the output clock signal 420 to determine when the in-use frequency division factor should be changed.

It will be appreciated that the comparison of the count of the received oscillating signal and/or output clock signal 420 with a predetermined value can be a convenient implementation for periodically replacing the in-use frequency division factor. Furthermore, changing the in-use frequency division factor in accordance with the received oscillating signal and/or output clock signal can reduce the likelihood that the in-use frequency division factor is changed part-way through a cycle, which could lead to inaccurate division factors being used.

The output of the second summation component 426 is shown with reference 427 in FIGS. 4 and 5, and the output of the second counter 423 is shown as reference 425.

It will be appreciated that a change rate of 1d would generate a second counter output signal 425 with a frequency of 2 KHz, and a change rate of 4d would generate a second counter output signal 425 with a frequency of 0.5 KHz.

In some embodiments, the functionality for a user to select a desired change rate may be considered optional.

The Q output 425 of the third register 424 is also provided as a clock input to a linear feedback shift register (LFSR) 432 with 0/+15 output decode. The linear feedback shift register 432 is a pseudo-random digital word generator and outputs the next word in the pseudo random sequence when it receives a rising edge from the second counter 423.

From a given starting point the LFSR will always generate the same word sequence within the bounds of 0 and 15, but the generated word sequence has no "order" in it. In this way, words can be decoded to generate numbers in a given range and the sequence of the values that are generated is pseudo-random and bounded by the decoding. In this example, the lower bound is 0 and the upper bound is 15. In other examples, a smaller LFSR (a 4 bit LFSR is used in this case to generate digital words ranging from 0 to 15) could be used, although the sequence repetition rate can be linked to the LFSR size. Therefore, the sequence of frequency division factors may become less pseudo-random as the digital words will be repeated every 16 clock cycles.

An example LFSR output signal 433 is shown in FIG. 5 as having a value between 0 and 15 for a period of time represented by the "change rate" as discussed above.

In some embodiments, an optional synchronisation component 430 can be provided between the Q output of the third register 424 and the clock input of the LFSR 432. The synchronisation component 430 can be used to compensate for any delays between the oscillator signal and the Q output signal generated by the third register 424.

The output 433 of the LFSR 432 is provided as an input to a shift left component 434. The shift left component 434 receives an amplitude signal 436 that is representative of the maximum jitter that is applied to the output clock signal. The amplitude signal 436 may also be considered as a jitter range input signal.

It will be appreciated that the "maximum jitter" is the peak deviation of the frequency with respect to the centre frequency.

The output of the LFSR 432 provides a digital word with values between 0 and 15 and can be considered as a variable number that will be added to a fixed number to provide an in-use frequency division factor. The variable and fixed numbers may be considered as components of a frequency division factor. As will be appreciated from the following description, the range of output values generated by the LFSR 432 represents the maximum amplitude/frequency jitter that can be achieved.

The shift left component 434 in this example is configured to either apply a shift left operation by two bits, one bit, or zero bits to the word that is received from the LFSR 432. The shift left component 434 can be considered as a divider because it is known that a shift left operation by two bits performs a divide by four function, a shift left operation by one bit performs a divide by two operation, and a shift left operation by zero bits performs a divide by one operation.

In some embodiments, the shift left component 434 may be considered as optional because it allows a user to control the degree of frequency jitter up to a maximum value as defined by the output of the LFSR 432, and in other embodiments such functionality may not be required.

The digital word output of the shift left component 434 is provided as an overflow input to a third counter 438, in order to provide the counter 438 with a variable component of the frequency division factor that is to be used.

Provided to the reset input of the third counter 438 is one of three signals 440, 441, 442 that is selected in accordance with the amplitude signal 436 that is provided to the shift left component 434. The signal provided to the reset input of the third counter 438 is representative of the fixed component of the frequency division factor that is to be used.

A first fixed component signal for the third counter 438 is given reference 440 in FIG. 4, and represents a fixed component of the frequency division factor having a value of 96. The first fixed component signal 440 is provided to an input of the third counter 438 when the amplitude signal 436 is representative of a maximum frequency jitter of fifteen. In this way, the fixed component of 96 is added to a variable component in the range of 0 to 15 so that the centre value of the range of frequency division factors is set as 104 (the sum of the fixed component and the average value of the variable component).

The second fixed component signal 441 represents a fixed component of the frequency division factor having a value of 100, and is used when the maximum frequency jitter is 7 clock cycles, that is when the shift left component 434 has divided the output signal of the LFSR by two. The second fixed component signal 441 also ensures that the centre value of the range of frequency division factors is 104.

The third fixed component signal 442 represents a fixed component of the frequency division factor having a value of 102. The third fixed component signal 442 is used for a maximum jitter of 3 clock cycles, and again ensures that the centre value of the range of frequency division factors remains at 104, irrespective of the amplitude of the frequency jitter that is applied.

In this example, the three fixed component signals 440, 441, 442 are provided as inputs to a multiplexer 443, and the amplitude signal 436 is used to select which of the three fixed component signals 440, 441, 442 is provided as the output of the multiplexer 443 and hence to the input of the third counter 438.

The output of the third counter 438 is representative of the in-use frequency division factor and consists of the sum of the variable and fixed components. The lower bound of the in-use frequency division factor is the sum of the minimum value of the variable component and the fixed component, and the upper bound of the in-use frequency division factor is the sum of the maximum value of the variable component and the fixed component.

The output of the third counter 438 is optionally provided to a second synchronisation unit 442 configured to compensate for any delays that are caused by the components shown in FIG. 4.

The output 415 of the third counter 438 (or second synchronisation unit 442 if there is one) is provided as the second input to the X-OR gate 416 identified above.

It will be appreciated from the above description that signals that are referred to as 1d, 2d etc., are fixed digital signals representative of decimal multiples that are applied to the oscillator signal 412. That is, for a counter with an input of 1d, the count will increment by 1 at each clock pulse, for example from 16-17-18-19-20-21-etc. For a counter with an input of 2d, the count will increase by 2 at each clock pulse, for example from 16-18-20-22-etc.

The embodiment of FIG. 5 can be adapted so that the in-use frequency division factor can be varied according to a triangular waveform, such that the frequency varies regularly from a minimum value to a maximum value, and back down to the minimum value. This can create a low frequency component in a subsequently generated PWM signal. As the human ear is not sensitive to all frequencies in the same way, and the audio noise generated by the SMPS can be a combination of the frequency modulation speed, amplitude, and the application components, amongst others, the functionality of being able to provide a user with the functionality to tune the system can enable any audio noise generated by the SMPS to be controlled in an improved way when compared with the prior art.

It will be appreciated that embodiments of the invention can be used with any device that requires a clock signal, and any type of switched mode power supply. Embodiments of the invention are not limited to flyback converters, and can also be used with a Buck converter, a Boost converter, a Buck-Boost converter, or any other type of power supply or component that utilises a clock signal.

Figure 6:
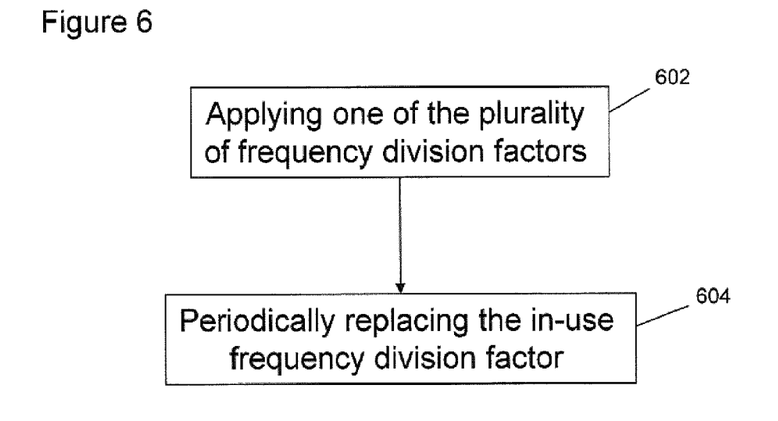
FIG. 6 illustrates schematically a method according to an embodiment of the invention.

FIG. 6 illustrates schematically the process flow of a method of operating a clock signal generator according to an embodiment of the invention. The clock signal generator has a frequency divider having a plurality of frequency division factors associated therewith, and examples of such clock signal generators are provided above.

The process flow begins at step 602 by applying one of the plurality of frequency division factors to a signal received from an oscillator in order to generate a clock signal. The frequency division factor that is applied may be considered as an in-use frequency division factor. The clock signal can be used by a switch mode power supply (SMPS), and more particularly a switching component of an SMPS that can generate a pulse width modulated (PWM) signal.

The process flow continues at step 604 by periodically replacing the in-use frequency division factor with another of the plurality of frequency division factors. In this way, the instantaneous frequency of the generated clock signal can be adjusted over time and this can cause any electromagnetic interference (EMI) to be spread out over a frequency spectrum as opposed to being focused at a single frequency. It will be appreciated that EMI emissions can cause problems with associated circuits and can incur additional costs in circuit design in order to counteract, or alleviate, the effects of the EMI emissions.

Figure 7:
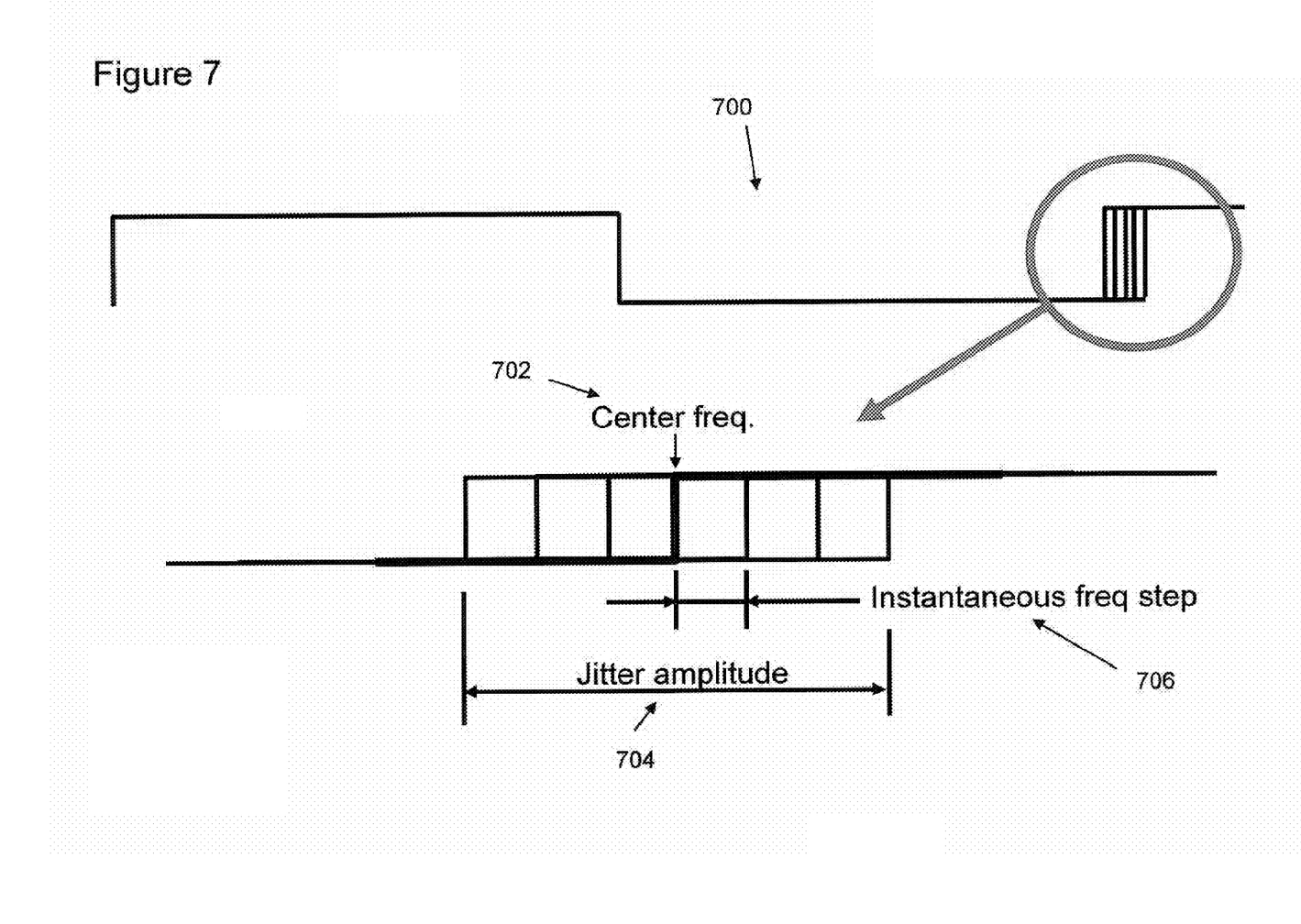
FIG. 7 illustrates schematically an output clock signal generated according to an embodiment of the invention.

FIG. 7 illustrates schematically an output clock signal 700 that can be generated according to an embodiment of the invention. The output clock signal 700 illustrates how the frequency of the clock signal can be considered to vary about a centre frequency 702 by a "jitter amplitude" 704. The upper and lower bounds of the jitter amplitude 704 represent the maximum and minimum instantaneous frequency values of the clock signal 702, and consists of a number of discrete steps 706 that represent the different frequency division factors that can be applied at any given instant in time.

Embodiments described herein can be used with an SMPS as part of battery charger for a device. The device can be a mobile telephone, a laptop computer, any device having a USB port, a digital photo frame, a camera, a camcorder, or any device with batteries or any other device that is connectable to a mains power supply as non-limiting examples. In addition, one or more embodiments of the invention can be used with an SMPS that is used to power one or more LED strings.

An embodiment of the invention can comprise a single high frequency oscillator, a divider having multiple integer division values being connected to said high frequency oscillator, a control circuit connected to said divider, said control circuit establishing a sequence of division factors, said division factors being the same as said integer division values. The output of the divider can be used as Pulse Width Modulation frequency and as an input to the said control circuit.

In some embodiments, low frequency clock generation with pre-determined jitter characteristics derived from a high frequency clock, using only one oscillator can be achieved.

Advantages associated with embodiments of the invention can include: the production of known jitter characteristics, as well as advanced jitter characteristics whereby noise shaping can be introduced, as an example; and the use of only one oscillator, whereas the prior art typically uses two oscillators. In addition a digital to analogue converter (DAC) may not be required, and switched capacitors may also not be required.

The invention claimed is:

1. A clock signal generator comprising:
  an input pin for receiving an oscillating signal;
  an output pin for providing an output clock signal;
  a frequency divider connected between the input pin and the output pin, the frequency divider having a plurality of frequency division factors associated therewith, wherein, in use, the frequency divider is configured to apply one of the plurality of frequency division factors as an in-use frequency division factor to the oscillating signal in order to generate the output clock signal;

a counter configured to count the number of pulses in the output clock signal;

a shift register configured to store a component of the plurality of frequency division factors and provide the component of a frequency division factor at an output of the shift register;

a divider configured to divide the component of a frequency division factor that is output by the shift register in accordance with a jitter range input signal in order to provide a variable component of a frequency division factor;

a controller configured to:
replace the in-use frequency division factor with another of the plurality of frequency division factors when a count of the counter reaches a predetermined value; and
shift the components of the plurality of frequency division factors through the shift register, such that a next component of the plurality of frequency division factors stored in the shift register contributes to the in-use frequency division factor for the frequency divider when replacing the in-use frequency division factor.

2. The clock signal generator of claim 1, wherein the counter is configured to receive a signal representative of a desired change rate of the in-use frequency division factor, and the counter is configured to apply a multiplier to the count in accordance with the desired change rate signal.

3. The clock signal generator of claim 2, wherein the signal representative of a desired change rate is representative of user input.

4. The clock signal generator of claim 1, wherein the plurality of frequency division factors comprise a sequence of frequency division factors, and the controller is configured to apply the frequency division factor that is next in the sequence of frequency division factors after the in-use frequency division factor when replacing the in-use frequency division factor, wherein the controller is configured to sequentially apply the frequency division factors in reverse order when the end of the sequence is reached.

5. The clock signal generator of claim 4, wherein the sequence of frequency division factors is a pseudo randomly generated sequence of frequency division factors between upper and lower bounding values.

6. The clock signal generator of claim 1, wherein the controller further comprises a jitter range input configured to receive a signal representative of an upper and lower bounding value of the plurality of frequency division factors, and wherein the controller is configured to apply a plurality of frequency division factors that satisfy the upper and lower bounding values of frequency division factors.

7. A clock signal generator comprising:
an input pin for receiving an oscillating signal;
an output pin for providing a clock signal;
a frequency divider connected between the input pin and the output pin, the frequency divider having a plurality of frequency division factors associated therewith, wherein, in use, the frequency divider is configured to apply one of the plurality of frequency division factors as an in-use frequency division factor to the oscillating signal in order to generate the clock signal; and
a controller configured to periodically replace the in-use frequency division factor with another of the plurality of frequency division factors;
a shift register configured to store a component of the plurality of frequency division factors, and wherein the controller is configured to shift the components of the plurality of frequency division factors through the shift register, such that the next component of the plurality of frequency division factors stored in the shift register contributes to the in-use frequency division factor for the frequency divider when periodically replacing the in-use frequency division factor; and
a divider configured to divide the component of a frequency division factor that is output by the shift register in accordance with a jitter range input signal in order to provide a variable component of a frequency division factor.

8. The clock signal generator of claim 7, wherein the jitter range input signal is representative of user input.

9. The clock signal generator of claim 7, further comprising a summation component configured to add the variable component of a frequency division factor to a fixed component of a frequency division factor in order to provide a frequency division factor, wherein the value of the fixed component of a frequency division factor is selected in accordance with the jitter range input signal.

10. The clock signal generator of claim 9, wherein the value of the fixed component of a frequency division factor is selected in accordance with the jitter range input signal such that the sum of the time-averaged value of the variable component and the fixed component represents a centre frequency of the clock signal.

11. A system comprising:
an oscillator for generating an oscillating signal; and
a clock signal generator according to claim 7; wherein the oscillator is connected to the clock signal generator such that the oscillating signal of the oscillator is provided to the input pin of the clock signal generator.

12. The system of claim 11, wherein the system comprises only one oscillator.

13. The system of claim 11, further comprising a switched mode power supply that is controllable by the clock signal.

14. A low power adapter comprising the clock signal generator according to claim 7.

15. A battery charger for a device, the battery charger comprising:
a switched mode power supply;
an oscillator; and
a clock signal generator according to claim 10;
wherein the oscillator is connected to the clock signal generator such that the oscillating signal of the oscillator is provided to the input pin of the clock signal generator, and the switched mode power supply is controllable by the clock signal of the clock signal generator.

16. A method of operating a clock signal generator, the clock signal generator comprising a frequency divider having a plurality of frequency division factors associated therewith, and the method comprising:
applying one of the plurality of frequency division factors as an in-use frequency division factor to frequency divide a signal received from an oscillator and provide a clock signal;
counting the number of pulses in the clock signal;
storing, by a shift register, a component of the plurality of frequency division factors;
providing the component of a frequency division factor at an output of the shift register;
dividing the component of a frequency division factor that is output by the shift register in accordance with a jitter range input signal in order to provide a variable component of a frequency division factor;
replacing the in-use frequency division factor with another of the plurality of frequency division factors when the counter reaches a predetermined value; and
shifting the components of the plurality of frequency division factors through the shift register, such that a next component of the stored plurality of frequency division factors contributes to the in-use frequency division factor when replacing the in-use frequency division factor.

17. The system of claim 11, wherein the switched mode power supply that is a flyback converter, a Buck converter, a Boost converter, or, a Buck-Boost converter.

* * * * *